US008178865B2

(12) United States Patent
Jeong

(10) Patent No.: US 8,178,865 B2
(45) Date of Patent: May 15, 2012

(54) ORGANIC LIGHT EMITTING DISPLAY DEVICE INCLUDING A PLURALITY OF SWITCHING ELEMENTS FOR TESTING THE SAME

(75) Inventor: Jin-Tae Jeong, Yongin (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 234 days.

(21) Appl. No.: 12/424,429

(22) Filed: Apr. 15, 2009

(65) Prior Publication Data

US 2009/0267496 A1    Oct. 29, 2009

(30) Foreign Application Priority Data

Apr. 25, 2008 (KR) ........................ 10-2008-0038626

(51) Int. Cl.
*H01L 29/08* (2006.01)
(52) U.S. Cl. ................. 257/40; 438/99; 257/59; 257/72; 257/350
(58) Field of Classification Search .................. 324/770; 257/40; 438/99
See application file for complete search history.

(56) References Cited

U.S. PATENT DOCUMENTS

| | | | | |
|---|---|---|---|---|
| 5,909,035 A | * | 6/1999 | Kim ................................ | 257/59 |
| 6,028,442 A | * | 2/2000 | Lee et al. ........................ | 324/770 |
| 6,873,174 B2 | * | 3/2005 | Matsunaga et al. ........... | 324/770 |
| 7,157,858 B2 | | 1/2007 | Sato et al. | |
| 7,646,367 B2 | * | 1/2010 | Kimura .......................... | 345/82 |
| 2005/0110721 A1 | * | 5/2005 | Shin et al. ...................... | 345/76 |
| 2006/0156143 A1 | * | 7/2006 | Tsai et al. ..................... | 714/742 |
| 2007/0046581 A1 | * | 3/2007 | Kwak et al. .................... | 345/68 |

FOREIGN PATENT DOCUMENTS

| | | |
|---|---|---|
| JP | 2002-090424 A | 3/2002 |
| JP | 2006-276368 | 10/2006 |
| JP | 2007-79599 | 3/2007 |
| KR | 10-2006-0013999 | 2/2006 |
| KR | 10-2006-0101103 | 9/2006 |
| KR | 10-2007-0055738 | 5/2007 |

OTHER PUBLICATIONS

KIPO Office action dated Jun. 23,2009, for priority Korean application 10-2008-0038626.
KIPO Office action dated Aug. 28, 2009, for priority Korean application 10-2008-0038626, noting the listed reference in this IDS, as well as JP 2006-276368 and KR 10-2006-0101103 previously filed in an IDS dated Sep. 17, 2009.

* cited by examiner

*Primary Examiner* — Wai Sing Louie
*Assistant Examiner* — Bilkis Jahan
(74) *Attorney, Agent, or Firm* — Christie, Parker & Hale, LLP

(57) ABSTRACT

An organic light emitting display device includes a plurality of pixels each coupled to a corresponding one of previous scan lines, a corresponding one of current scan lines, and a data line; first switching elements coupled between the previous scan lines of the pixels and a first test pad, and configured to turn on during a first period of a test period to provide a first test control signal supplied from the first test pad to the pixels; and second switching elements coupled between the current scan lines of the pixels and a second test pad, and configured to turn on during a second period of the test period to provide a second test control signal supplied from the second test pad to the pixels.

16 Claims, 7 Drawing Sheets

ORGANIC LIGHT EMITTING DISPLAY DEVICE INCLUDING A PLURALITY OF SWITCHING ELEMENTS FOR TESTING THE SAME

CROSS-REFERENCE TO RELATED APPLICATIONS

This application claims priority to and the benefit of Korean Patent Application No. 10-2008-0038626, filed on Apr. 25, 2008, in the Korean Intellectual Property Office, the entire content of which is incorporated herein by reference.

BACKGROUND OF THE INVENTION

1. Field of the Invention

The present invention relates to an organic light emitting display device, and more particularly, to a lighting test of an organic light emitting display device.

2. Description of Related Art

Recently, there have been developed various types of flat panel display devices having less weight and volume than cathode ray tube display devices.

Among these flat panel display devices, an organic light emitting display device has excellent luminance and color purity by displaying images using organic light emitting diodes (OLEDs) that are self light-emitting devices. Accordingly, the organic light emitting display device has been spotlighted as a next-generation display device.

The organic light emitting display device can be categorized as a passive matrix type organic light emitting display device or an active matrix type organic light emitting display device, depending on a method of driving the OLEDs.

The active matrix type organic light emitting display device includes a plurality of pixels positioned at crossing regions of scan and data lines. Each of the pixels includes an OLED and a pixel circuit for driving the OLED. Because of an advantage of less power consumption, the active matrix type organic light emitting display devices are widely used for portable display devices and the like.

However, in the active matrix type organic light emitting display device, a luminance difference between pixels may occur due to a threshold voltage variation among driving transistors, so image quality may be deteriorated.

Therefore, pixel circuits of various structures have been proposed to compensate for the threshold voltage variation among the driving transistors. For example, a pixel circuit employing a compensation transistor that allows a driving transistor to be diode-connected during a predetermined period is widely known.

Generally, an initialization transistor and a light emitting control transistor are employed together with the compensation transistor in the pixel circuit.

The initialization transistor is employed to allow a data signal to be stably supplied to a pixel when the threshold voltage variation is compensated for by diode-connecting a driving transistor. The initialization transistor initializes a node to which a gate electrode of the driving transistor is connected before a data signal is written in a pixel. That is, the initialization transistor is turned on during an initialization period before a programming period in which the data signal is written in the pixel.

The light emitting control transistor is employed to allow each pixel to stably emit light after performing the initialization and writing of the data signal. For this, the light emitting control transistor is turned on during a light emitting period following the initialization and programming periods.

Here, the initialization period is set to be a period in which a previous scan signal is supplied to a pixel, and the programming period is set to be a period in which a current scan signal is supplied to the pixel. The light emitting period is set to be a period in which the voltage level of a light emitting control signal is set to a low level.

That is, each of the pixels is driven corresponding to the previous and current scan signals and light emitting control signal, which are subsequently shifted and supplied.

Thus, when performing a lighting test for inspecting failures of pixels, three timing signals (a previous scan signal, a current scan signal and a light emitting control signal) should be sequentially supplied to each of the pixels.

A failure test such as a lighting test should be performed in the state that a driving circuit used in actual driving, e.g., a scan driver and/or a light emitting driver, is built in a panel of the organic light emitting display device.

However, in the case that a defect occurs in a built-in circuit, or its characteristic is changed when included in a large-sized panel, it is difficult to repair the built-in circuit. That is, a faulty panel having a built-in circuit in which a defect occurs may not be released as a product and may be scrapped. In this case, module components such as FPC, IC and bonding materials and manufacturing time, which are consumed in the faulty panel, may be wasted.

Therefore, it is desirable that a lighting test is performed in a panel with no built-in circuit, then a driving circuit, for example in the form of an integrated circuit (IC) chip, is installed or mounted on the panel.

However, in the event that no built-in circuit exists, a lighting test may not be performed before the installation of an IC chip.

SUMMARY OF THE INVENTION

Accordingly, embodiments of the present invention provide an organic light emitting display device that can perform a lighting test before the mounting and/or installation of the driving circuits used in normal operation of the organic light emitting display device.

According to an embodiment of the present invention, an organic light emitting display device includes: a plurality of pixels each coupled to a corresponding one of previous scan line, a corresponding one of current scan lines, and a data line; first switching elements coupled between the previous scan lines of the pixels and a first test pad, and configured to turn on during a first period of a test period to provide a first test control signal supplied from the first test pad to the pixels; and second switching elements coupled between the current scan lines of the pixels and a second test pad, and configured to turn on during a second period of the test period following the first period to provide a second test control signal supplied from the second test pad to the pixels.

The first and second test control signals may be sequentially shifted and supplied.

The first and second switching elements may include transmission gates each having a positive electrode coupled to a first control pad and a negative electrode coupled to a second control pad. A first control signal supplied to the first control pad and a second control signal supplied to the second control pad may be inverted signals of each other.

Each of the pixels may be further coupled to a corresponding one of light emitting control lines. The organic light emitting display device may further include third switching elements coupled between the light emitting control lines of the pixels and a third test pad, and configured to turn on during a third test period of the test period following the second period to provide a third test control signal supplied from the third test pad to the pixels. The third switching elements may include transmission gates each having a positive electrode coupled to a first control pad and a negative electrode coupled to a second control pad. A first control signal supplied to the first control pad and a second control signal supplied to the second control pad may be inverted signals of each other.

The organic light emitting display device may further include fourth switching elements each coupled between the pixels in a k-th row coupled to the corresponding one of the previous scan lines and the pixels in a (k−1)-th row coupled to the corresponding one of the current scan lines, and configured to maintain an off-state during the test period. The k is a natural number. The fourth switching elements may include transmission gates each having a positive electrode coupled to a second control pad and a negative electrode coupled to a first control pad.

According to another embodiment of the present invention, a display panel of an organic light emitting display device includes a display unit having a plurality of pixels, first switching elements coupled to the pixels for providing a first test control signal to the pixels during a first period of a lighting test period, second switching elements coupled to the pixels for providing a second test control signal to the pixels during a second period of the lighting test period, and third switching elements coupled to the pixels for providing a third test control signal during a third period of the lighting test period. The first, second and third switching elements are configured to turn on during the lighting test period, and the first and second test control signals are sequentially shifted and supplied.

The display panel of the organic light emitting display device may further include fourth switching elements each coupled between a corresponding one of previous scan lines of the pixels in a k-th row and a corresponding one of current scan lines of the pixels in a (k−1)-th row. The fourth switching elements are configured to maintain an off-state during the lighting test period. The k is a natural number.

The first, second and third switching elements may include transmission gates each having a positive electrode coupled to a first control pad and a negative electrode coupled to a second control pad.

A first control signal supplied to the first control pad and a second control signal supplied to the second control pad may be inverted signals of each other.

According to the embodiments of the present invention, a lighting test is performed in the state that a driving circuit is not built in an organic light emitting display device, thereby detecting failures of pixels in advance. Accordingly, it is possible to prevent module components such as FPC, IC and bonding materials and manufacturing time, which are consumed in a faulty panel, and manufacturing costs from being wasted.

Further, since all pixels are simultaneously driven when testing failures of the pixels, the pixels can be lighted for a sufficient period of time.

BRIEF DESCRIPTION OF THE DRAWINGS

The accompanying drawings, together with the specification, illustrate exemplary embodiments of the present invention, and, together with the description, serve to explain the principles of the present invention.

DETAILED DESCRIPTION OF EXEMPLARY EMBODIMENTS

Figure 1:
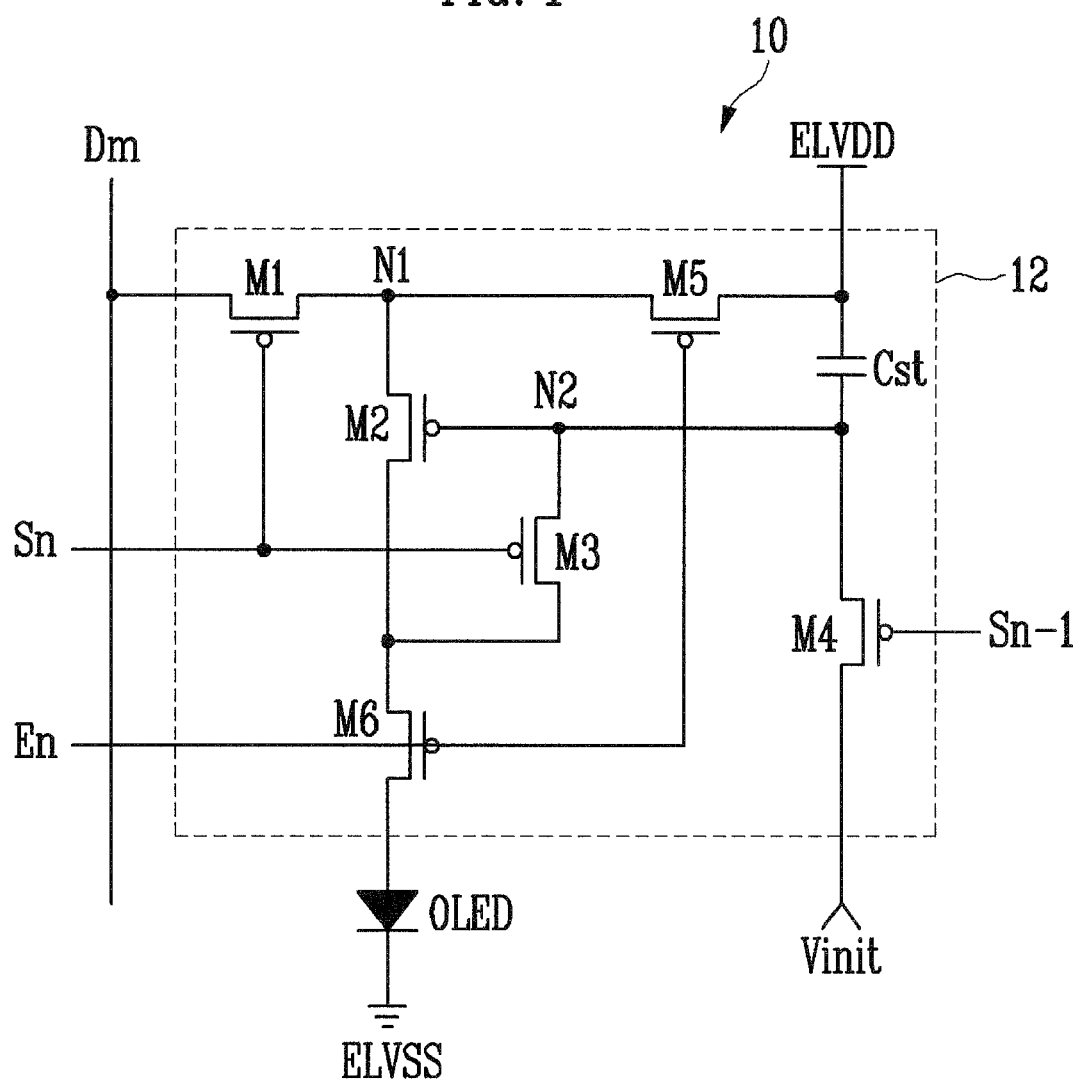
FIG. 1 is a circuit diagram showing a pixel according to an embodiment of the present invention.

Hereinafter, certain exemplary embodiments according to the present invention will be described with reference to the accompanying drawings. Here, when a first element is described as being coupled to a second element, the first element may be directly coupled to the second element or may be indirectly coupled to the second element via a third element. Further, some of the elements that are not essential to the complete understanding of the invention are omitted for clarity. Also, like reference numerals refer to like elements throughout.

FIG. 1 is a circuit diagram showing a pixel 10 according to an embodiment of the present invention.

Referring to FIG. 1, the pixel 10 includes an organic light emitting diode (OLED) and a pixel circuit 12 for driving the OLED.

An anode electrode of the OLED is coupled to the pixel circuit 12, and a cathode electrode of the OLED is coupled to a second pixel power source ELVSS. The OLED generates light having a luminance (e.g., a predetermined luminance) corresponding to an amount of current provided from the pixel circuit 12.

The pixel circuit 12 includes first to six transistors M1 to M6 and a storage capacitor Cst.

The first transistor M1 is coupled between a data line Dm and a first node N1, and a gate electrode of the first transistor M1 is coupled to a current scan line Sn. The first transistor M1 provides a data signal supplied from the data line Dm to the first node N1 in response to a current scan signal supplied to the current scan line Sn.

The second transistor M2 is coupled between the first node N1 and the OLED, and a gate electrode of the second transistor M2 is coupled to a second node N2. The second transistor M2 controls an amount of current that flows into the OLED corresponding to the voltage level at the second node N2.

Here, when the current scan signal is supplied, the data signal transmitted through the data line Dm is stored by the storage capacitor Cst, so that the voltage level at the second node N2 is maintained. Therefore, an amount of current that flows through the second transistor M2 is set to be a value corresponding to the data signal.

The third transistor M3 is coupled between one electrode of the second transistor M2 and the gate electrode of the second transistor M2. When the current scan signal is supplied to the current scan line Sn, the third transistor M3 is turned on to diode-connect the second transistor M2.

The fourth transistor M4 is coupled between the second node N2 and an initialization power source Vinit, and a gate electrode of the fourth transistor M4 is coupled to a previous scan line Sn−1. When a previous scan signal is supplied to the previous scan line Sn−1, the fourth transistor M4 is turned on to initialize the second node N2.

The fifth transistor M5 is coupled between a first pixel power source ELVDD and the first node N1, and a gate electrode of the fifth transistor M5 is coupled to a light emitting control line En. When a light emitting control signal (e.g., a high level signal) is supplied from the light emitting control line En, the fifth transistor M5 is turned off to isolate the first pixel power source ELVDD from the first node N1. If the supply of the light emitting control signal is stopped (e.g., the voltage level of the light emitting control signal is set to a low level signal), the fifth transistor M5 is turned on so that the first pixel power source ELVDD is coupled to the first node N1. Accordingly, the second transistor M2 is coupled to the first pixel power source ELVDD.

The sixth transistor M6 is coupled between the second transistor M2 and the OLED, and a gate electrode of the sixth transistor M6 is coupled to the light emitting control line En. When the light emitting control signal (e.g., a high level signal) is supplied from the light emitting control line En, the sixth transistor M6 is turned off to prevent a current from being supplied to the OLED. That is, the sixth transistor M6 prevents the OLED from emitting light while the light emitting control signal is supplied. The sixth transistor M6 is turned on during the period in which the light emitting control signal (e.g., a low level signal) is supplied so that the second transistor M2 is coupled to the OLED. Accordingly, a current supplied from the second transistor M2 is provided to the OLED.

The storage capacitor Cst is coupled between the first pixel power source ELVDD and the second node N2. The storage capacitor Cst is initialized by initialization power source Vinit supplied to the second node N2 through the fourth transistor M4 during the period in which the previous scan signal is supplied to the previous scan line Sn−1. The storage capacitor Cst stores a data signal supplied via the first to third transistors M1 to M3 during the period in which the current scan signal is supplied to the current scan line Sn. Since the second transistor M2 is diode-connected by the third transistor M3, a voltage corresponding to the difference between the data signal and the threshold voltage of the second transistor M2 is supplied to the second node N2. Accordingly, the effect caused by the threshold voltage of the second transistor M2 is offset (or reduced) during a subsequent light emitting period, so that the OLED can provide uniform luminance characteristics corresponding to the data signal.

By utilizing the storage capacitor Cst, the voltage at the second node N2 is maintained at a voltage corresponding to the data signal until when the next frame is started. Thus, the gate voltage of the second transistor M2 is kept constant during a light emitting period following the period in which the data signal is stored (or written).

The pixel 10 is initialized by the initialization power source Vinit during the period in which the previous scan signal is supplied, and the data signal supplied to the data line Dm is stored in the pixel 10 during the period in which the current scan signal is supplied. Thereafter, the pixel 10 emits light with luminance corresponding to the data signal during the subsequent light emitting period.

Figure 2:
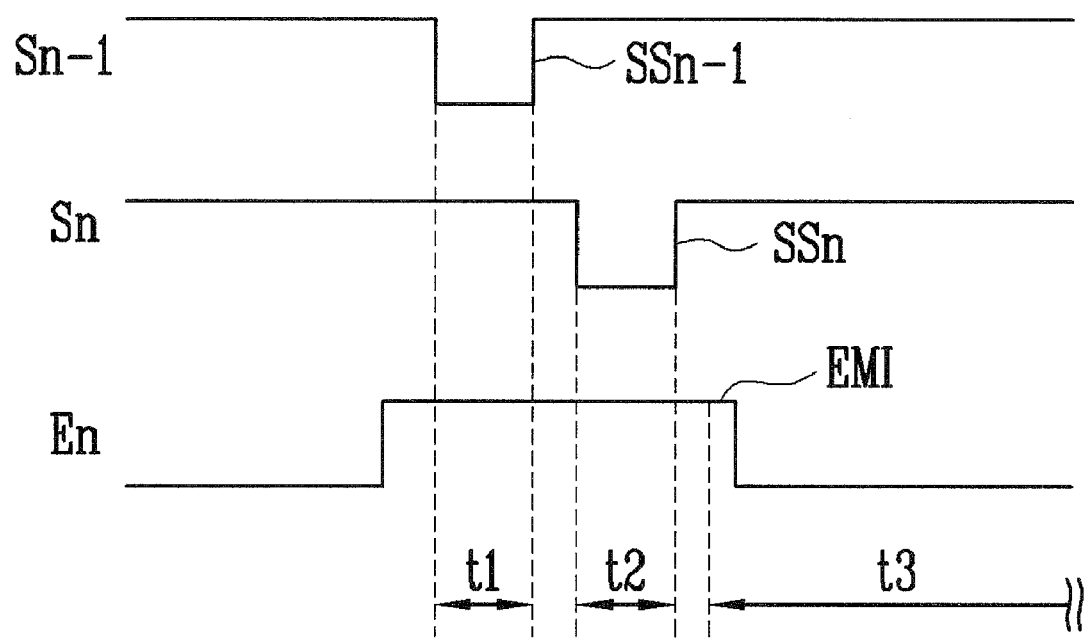
FIG. 2 is a waveform diagram of control signals for driving the pixel shown in FIG. 1.

FIG. 2 is a waveform diagram of control signals for driving the pixel 10 shown in FIG. 1. Hereinafter, a method of driving the pixel 10 shown in FIG. 1 will be described in detail with reference to FIGS. 1 and 2.

Referring to FIG. 2, when a previous scan signal SSn−1 of a low level is supplied to the previous scan line Sn−1 during a period t1, the fourth transistor M4 is first turned on. Then, the second node N2 is initialized by the initialization power source Vinit. That is, the period t1 is set to be an initialization period of the pixel 10.

Thereafter, when a current scan signal SSn of a low level is supplied to the current scan line Sn during a period t2, the first and third transistors M1 and M3 are turned on, and the second transistor M2 diode-connected by the third transistor M3 is turned on. Then, a data signal supplied from the data line Dm is supplied to the second node N2 via the first to third transistors M1 to M3.

Since the second transistor M2 is diode-connected, a voltage corresponding to the difference between the data signal and the threshold voltage of the second transistor M2 is supplied to the second node N2. The voltage supplied to the second node N2 is stored in the storage capacitor Cst. That is, the period t2 is set to be a programming period in which the data signal is stored (or written).

A light emitting control signal EMI of a high level is supplied to the light emitting control line En during the aforementioned periods t1 and t2. Therefore, the fifth and sixth transistors M5 and M6 are turned off during the periods t1 and t2 to prevent a current from being supplied to the OLED.

After the periods t1 and t2 are ended, the light emitting control signal EMI of a low level is supplied to the light emitting control line En during a period t3. Therefore, a current corresponding to the data signal flows into the second pixel power source ELVSS via the fifth, second and sixth transistors M5, M2 and M6 and the OLED from the first pixel power source ELVDD during the period t3. Accordingly, the OLED emits light with luminance corresponding to the data signal. That is, the period t3 is set to be a light emitting period of the pixel 10.

In order to stably drive the pixel 10 while compensating for a characteristic variation of the driving transistor (e.g., the second transistor M2), the pixel 10 may be designed to be driven corresponding to the previous scan signal, the current scan signal and the light emitting control signal, which are sequentially shifted and supplied.

Figure 3:
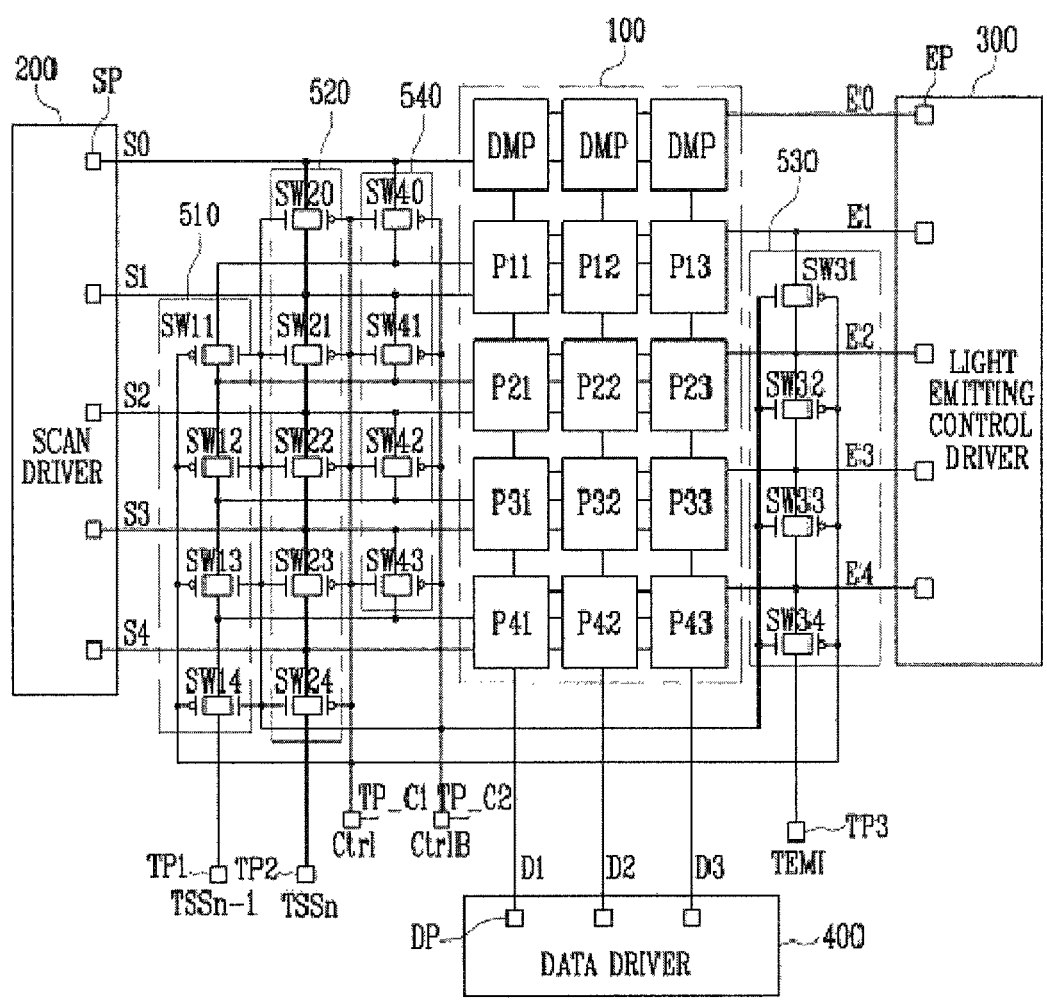
FIG. 3 is a schematic block diagram showing the structure of an organic light emitting display device according to an embodiment of the present invention.

FIG. 3 is a schematic block diagram showing the structure of an organic light emitting display device according to an embodiment of the present invention. Although pixels are arranged in a 4×3 matrix type in a display unit 100 of FIG. 3 for the convenience of illustration, a larger number of pixels may be practically arranged in the display unit 100. In FIG. 3, a scan driver 200 and a light emitting control driver 300 are formed at different sides of the display unit 100, respectively. However, the present invention is not limited thereto, the scan driver 200 and the light emitting control driver 300 may be practically configured in various forms. For example, the scan driver 200 and the light emitting control driver 300 may be formed together at one side of the display unit 100 as one component.

Referring to FIG. 3, the organic light emitting display device according to the embodiment of the present invention includes the display unit 100, the scan driver 200, the light emitting control driver 300, a data driver 400 and first to fourth switching units 510 to 540.

The display unit 100 includes a plurality of pixels P (e.g., P11, P12 ... P43) arranged in a matrix type at crossing regions of scan lines S, light emitting control lines E (e.g., E0, E1 ... E4) and data lines D (e.g., D1, D2 and D3).

Here, each of the pixels P is coupled to a previous scan line S, a current scan line S, a light emitting control line E and a data line D. For example, an eleventh pixel P11 is coupled to a first scan line S1, a light emitting control line E1 and a first data line D1, and coupled to a zeroth scan line S0 via a fortieth switching element SW40.

The pixels P may be designed in various structures. For example, each of the pixels P may be designed as shown in FIG. 1. In this case, the pixels P may be driven by three timing signals such as a previous scan signal, a current scan signal and a light emitting control signal to emit light with luminance corresponding to a data signal.

Dummy pixels DMP coupled to a zeroth light emitting control line E0 may be further formed above the pixels P.

The scan driver 200 sequentially generates scan signals corresponding to control signals supplied from the outside of the organic light emitting display device. The scan driver 200 is coupled to the scan lines S. The fourth switching unit 540 includes four switching elements SW40 to SW43 coupled to the scan lines S for providing the corresponding current scan lines S and previous scan lines S to the pixels P. Therefore, the scan driver 200 sequentially supplies the previous and current scan signals to the pixels P by row.

The light emitting control driver 300 sequentially generates light emitting control signals corresponding to control signals supplied from the outside of the organic light emitting display device. The light emitting control driver 300 is coupled to the light emitting control lines E to sequentially supply a light emitting control signal to the pixels P by row.

The data driver 400 generates data signals corresponding to data and control signals supplied from the outside of the organic light emitting display device. The data driver 400 is coupled to the data lines D to supply data signals to the pixels P.

However, after a failure test such as a lighting test is completed, the scan driver 200, the light emitting control driver 300 and the data driver 400 may be mounted in the form of an integrated circuit (IC) chip to be coupled to scan pads SP, light emitting control pads EP and data pads DP, respectively.

That is, the scan driver 200, the light emitting control driver 300 and the data driver 400 may be mounted in the form of an IC chip to be respectively coupled to the scan lines S, the light emitting control lines E and the data lines D of a panel in which a failure test is completed.

After a failure test is completed, the scan driver 200, the light emitting control driver 300 and the data driver 400 supply a scan signal, a light emitting control signal and a data signal, respectively, to the pixels P during an actual driving period in which the pixels P display an image corresponding to the data signal supplied from the data lines D.

The first switching unit 510 includes first switching elements SW11 to SW14 coupled between the previous scan lines (e.g. S0 to S3) of the pixels P and a first test pad TP1. For example, the first switching unit 510 includes the first switching elements SW11 to SW14, each one of which is formed for a corresponding row of the pixels P. Here, the first test pad TP1 is a pad for receiving a first test control signal TSSn−1 that is supplied during a test period in which a lighting test is performed. The first test control signal TSSn−1 is a signal that serves as a previous scan signal for initializing the pixel 10 as shown in FIG. 1.

The first switching elements SW11 to SW14 may include a variety of elements capable of performing switching functions. For example, the first switching elements SW11 to SW14 may be formed as transmission gates as shown in FIG. 3.

Here, positive electrodes of the first switching elements SW11 to SW14 may be commonly coupled to a first control pad TP_C1, and negative electrodes of the first switching elements SW11 to SW14 may be commonly coupled to a second control pad TP_C2.

Here, the first and second control pads TP_C1 and TP_C2 are pads for receiving the first and second control signals Ctrl and CtrlB, which have opposite waveforms to each other. That is, the second control signal CtrlB may be set to be a sub-signal of the first control signal Ctrl. However, the first and second control signals Ctrl and CtrlB are set to allow the first to third switching units 510 to 530 to be turned on and allow the fourth switching unit 540 to be turned off during the test period. Also, the first and second control signals Ctrl and CtrlB are set to allow the first to third switching units 510 to 530 to be turned off and allow the fourth switching unit 540 to be turned on during the actual driving period.

The first switching elements SW11 to SW14 are concurrently turned on corresponding to the first and second control signals Ctrl and CtrlB respectively supplied from the first and second control pads TP_C1 and TP_C2 during the test period. Then, the first switching elements SW11 to SW14 concurrently provide the first test control signal TSSn−1 supplied from the first test pad TP1 to the pixels P. Therefore, the pixels P are concurrently initialized.

The second switching unit 520 includes second switching elements SW20 to SW24 coupled between the scan lines S0 to S4 of the pixels P (the dummy pixels DMP may be included in the pixels P) and a second test pad TP2. For example, the second switching unit 520 includes the second switching elements SW20 to SW24, each one of which is formed for a corresponding row of the pixels P. Here, the second test pad TP2 is a pad for a second test control signal TSSn that is supplied during the test period, and the second test control signal TSSn is supplied by shifting the first test control signal TSSn−1. That is, the first and second test control signals TSSn−1 and TSSn are supplied to be sequentially shifted. In FIG. 3, the first test control signal TSSn−1 serves as a previous scan signal of the pixel 10 shown in FIG. 1, and the second test control signal TSSn serves as a current scan signal of the pixel 10 shown in FIG. 1.

The second switching elements SW20 to SW24 may include a variety of elements capable of performing switching functions. For example, the second switching elements SW20 to SW24 may be formed as transmission gates like the first switching elements SW11 to SW14.

In FIG. 3, positive electrodes of the second switching elements SW20 to SW24 are commonly coupled to the first control pad TP_C1, and negative electrodes of the second switching elements SW20 to SW24 are generally coupled to the second control pad TP_C2. That is, the second switching elements SW20 to SW24 may be set to be concurrently turned on with the first switching elements SW11 to SW14.

The second switching elements SW20 to SW24 are concurrently turned on corresponding to the first and second control signals Ctrl and CtrlB respectively supplied from the first and second control pads TP_C1 and TP_C2 during the test period. Then, the second switching elements SW20 to SW24 concurrently provide the second test control signal TSSn supplied from the second test pad TP2 to the pixels P. Here, a test signal for displaying a test screen is supplied to the data pad DP. The test signal is concurrently written in the pixels P via the second switching elements SW20 to SW24.

The third switching unit 530 includes third switching elements SW31 to SW34 coupled between light emitting control lines E1 to E4 of the pixels P and a third test pad TP3. For example, the third switching unit 530 may include a plurality of third switching elements SW31 to SW34, each one of which is formed for a corresponding row of the pixels P. Here, the third test pad TP3 is a pad for receiving a third test control signal TEMI that is supplied during the test period, and the third test control signal TEMI is a signal that serves as a light emitting control signal of the pixel 10 shown in FIG. 1.

The third switching elements SW31 to SW34 may include a variety of elements capable of performing switching functions. For example, the third switching elements SW31 to SW34 may be formed as transmission gates.

In FIG. 3, positive electrodes of the third switching elements SW31 to SW34 are commonly coupled to the first control pad TP_C1, and negative electrodes of the third switching elements SW31 to SW34 are commonly coupled to the second control pad TP_C2. That is, the third switching elements SW31 to SW34 may be set to be concurrently turned on with the first and second switching elements SW11 to SW14 and SW20 to SW24.

The third switching elements SW31 to SW34 are concurrently turned on corresponding to the first and second control signals Ctrl and CtrlB respectively supplied from the first and second control pads TP_C1 and TP_C2 during the test period. Then, the third switching elements SW31 to SW34 concurrently provide the third test signal TEMI that is supplied from the third test pad TP3 to the pixels P. Therefore, the pixels P emit light with luminance corresponding to the test signal written by the second switching elements SW20 to SW24 during the previous period.

The fourth switching unit 540 includes fourth switching elements SW40 to SW43 coupled between the previous scan lines (e.g., S0 to S3) of the pixels P. Each of the fourth switching elements SW40 to SW43 is coupled between a previous scan line corresponding to a k-th row (k is a natural number) and a current scan line corresponding to a (k−1)-th row. For example, the fourth switching unit 540 includes the fourth switching elements SW40 to SW43, each one of which is formed for a corresponding row of the pixels P.

The fourth switching elements SW40 to SW43 may include a variety of elements capable of performing switching functions. For example, the fourth switching elements SW40 to SW43 may be formed as transmission gates.

In FIG. 3, positive electrodes of the fourth switching elements SW40 to SW43 are commonly coupled to the second control pad TP_C2, and negative electrodes of the fourth switching elements SW40 to SW43 are commonly coupled to the first control pad TP_C1. That is, the fourth switching elements SW40 to SW43 are set to be turned on at a time different from the time when the first to third switching elements SW11 to SW14, SW20 to SW24, and SW31 to SW34 are turned on.

In other words, the fourth switching elements SW40 to SW43 maintain an off-state corresponding to the first and second control signals Ctrl and CtrlB respectively supplied from the first and second control pads TP_C1 and TP_C2 during the test period. After the test is completed, the fourth switching elements SW40 to SW43 maintain a turned-on state during a period in which the pixels P display an image corresponding to the data signal supplied via the data lines D1 to D3 from the data driver 400.

Therefore, the previous scan signals as well as the current scan signals supplied from the scan driver 200 are normally supplied to each of the pixels P.

Figure 4:
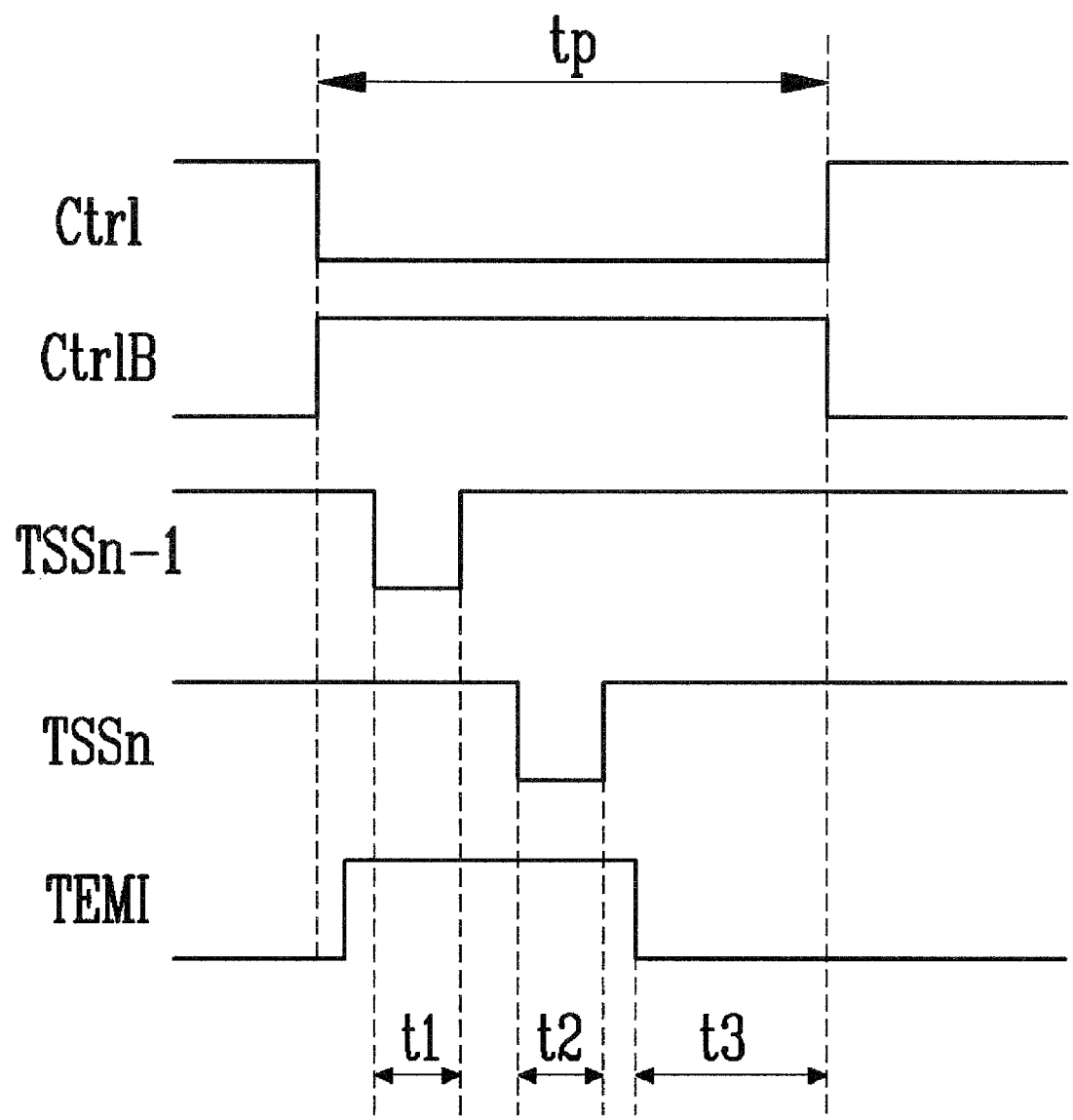
FIG. 4 is a waveform diagram of control signals for driving the organic light emitting display device shown in FIG. 3 during a test period.
Figure 5:
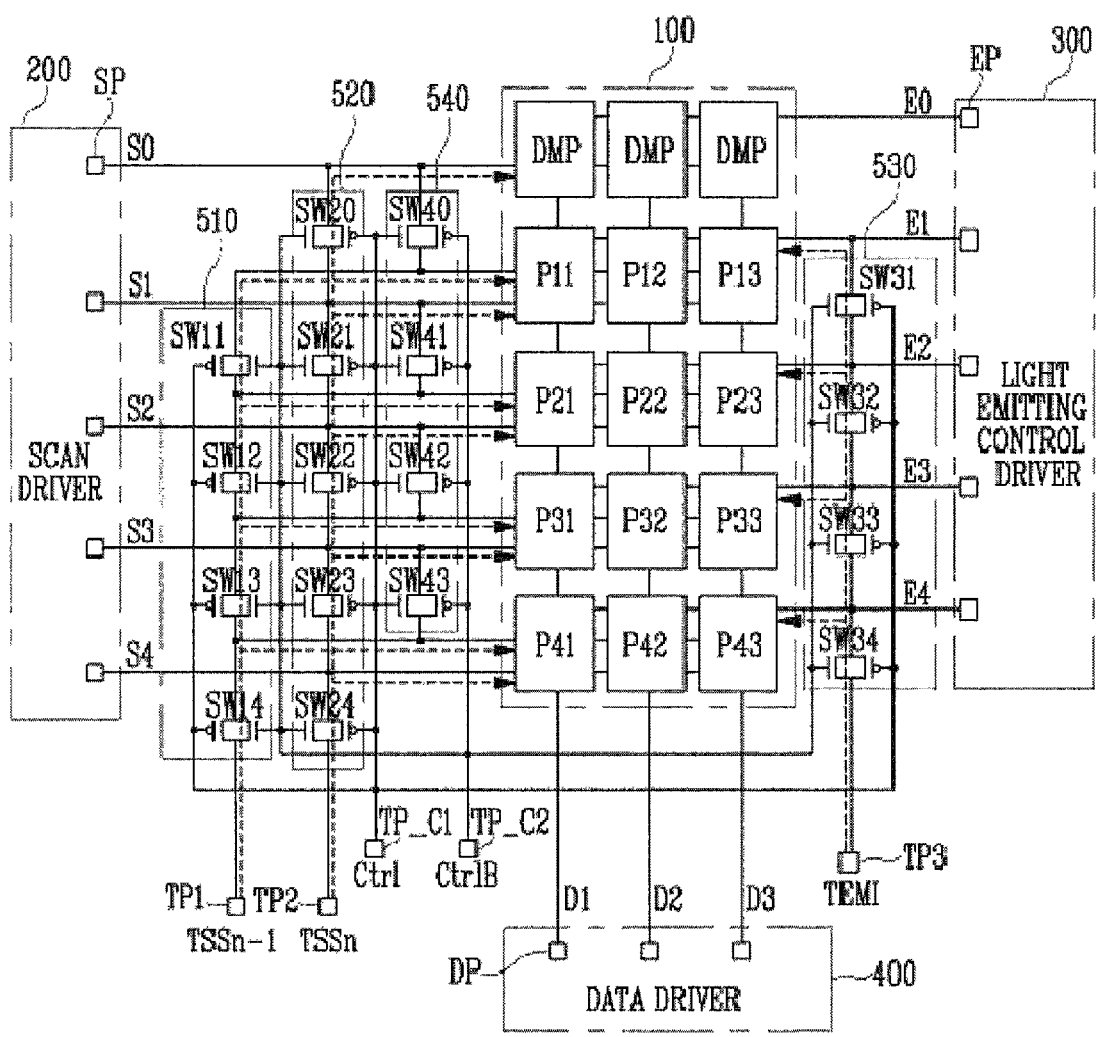
FIG. 5 is a schematic block diagram showing a path through which the control signals shown in FIG. 4 are supplied to the organic light emitting display device shown in FIG. 3.

FIG. 4 is a waveform diagram of control signals for driving the organic light emitting display device shown in FIG. 3 during a test period. FIG. 5 is a schematic block diagram showing paths through which the control signals shown in FIG. 4 are supplied to the organic light emitting display device shown in FIG. 3.

For convenience of illustration, a signal delay and the like caused while the signals pass through signal lines are not taken into account in the description. For example, when the term "concurrently" is used in the description of the embodiments of present invention, a signal delay in a signal line is not considered. Hence, the term "concurrently" encompasses "simultaneously" without limited thereto. Those skilled in the art would appreciate that a slight time difference may occur in practice. The scan driver 200, the light emitting control driver 300 and the data driver 400 are not mounted during the test period.

Referring to FIGS. 4 and 5, a first control signal Ctrl of a low level and a second control signal CtrlB of a high level are respectively supplied to the first and second control pads TP_C1 and TP_C2 during a test period tp. Here, the first to third switching elements SW11 to SW13, SW20 to SW24 and SW31 to SW34 included in the first to third switching units 510 to 530, respectively, are all turned on concurrently, and the fourth switching elements SW40 to SW43 included in the fourth switching unit 540 maintain a turned-off state.

A first test control signal TSSn−1 of a low level is supplied to the first test pad TP1 during a first period t1 of the test period tp. The first control signal TSSn−1 is supplied to the pixels P via the first switching elements SW11 to SW14. Therefore, the pixels P are initialized.

Thereafter, a second test control signal TSSn of a low level is supplied to the second test pad TP2 during a second period t2 of the test period tp. The second test control signal TSSn is supplied to the pixels P via the second switching elements SW20 to SW24. At this time, a test signal is supplied to the data pads DP. Therefore, the test signal is written in the pixels P.

Thereafter, a third test control signal TEMI supplied to the third test pad TP3 is changed to a low level and maintained as the low level during a third period t3 of the test period tp. The third test control signal TEMI is supplied to the pixels P via the third switching elements SW31 to SW34. Therefore, the pixels P emit light with luminance corresponding to the test signal written during the second period t2. The light emission of pixels P is tested, thereby performing a failure test such as a lighting test.

The process of initializing the pixels P and writing the test signal in the pixels P to emit light has been described with reference to the embodiment illustrated in FIGS. 1 and 2. Therefore, detailed description will be omitted.

According to the embodiments of the present invention, a lighting test is performed in the state that a driving circuit (e.g., the scan driver 200, the light emitting control driver 300 and/or the data driver 400) is not built in the organic light emitting display device, thereby detecting failures of the pixels P in advance. Accordingly, it is possible to prevent module components such as FPC, IC and bonding materials and manufacturing time, which are consumed in a faulty panel, and manufacturing costs from being wasted.

Since all the pixels P are concurrently driven when testing failures of the pixels P, the pixels P can be lighted for a sufficient period of time.

Figure 6:
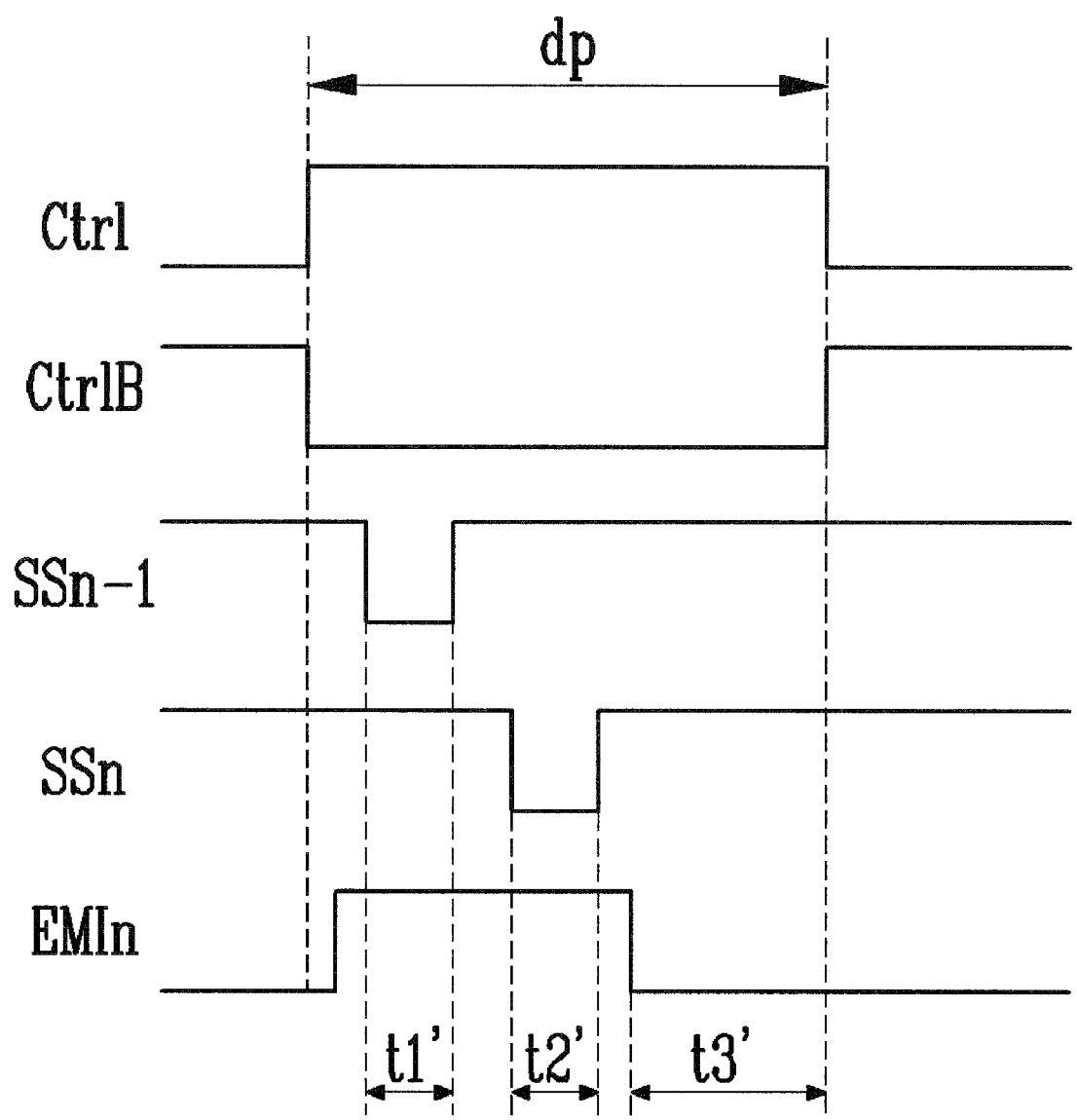
FIG. 6 is a waveform diagram of control signals for driving the organic light emitting display device shown in FIG. 3 during a driving period.
Figure 7:
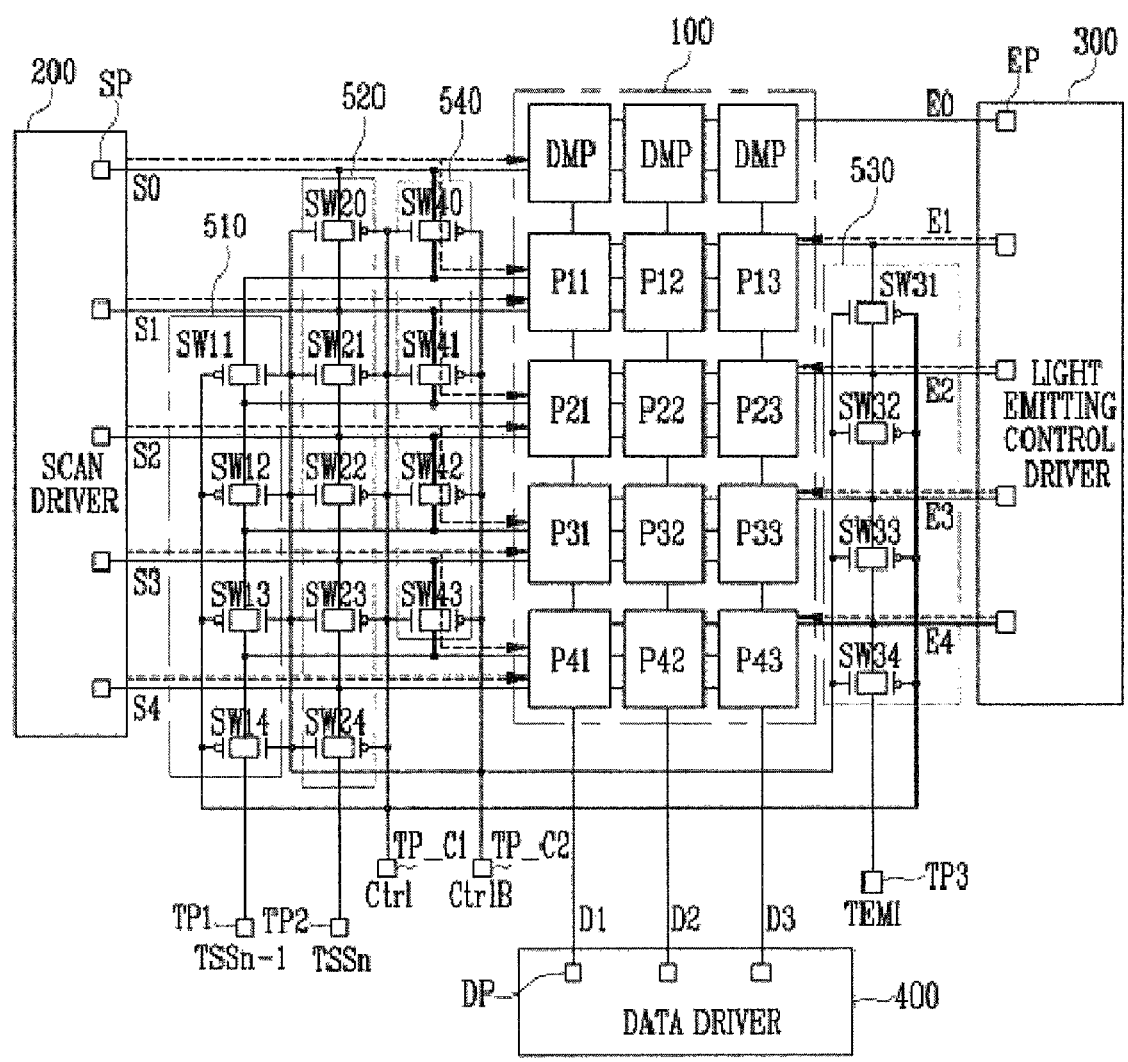
FIG. 7 is a schematic block diagram showing a path through which the control signals shown in FIG. 6 are supplied to the organic light emitting display device shown in FIG. 3.

FIG. 6 is a waveform diagram of control signals for driving the organic light emitting display device shown in FIG. 3 during a driving period. FIG. 7 is a schematic block diagram showing paths through which the control signals shown in FIG. 6 are supplied to the organic light emitting display device shown in FIG. 3. Here, the driving period is an actual driving period in which, with the scan driver 200, the light emitting control driver 300 and the data driver 400 mounted (or installed), the pixels P emit light corresponding to a data signal through the scan driver 200, the light emitting control driver 300 and the data driver 400.

Referring to FIGS. 6 and 7, a first control signal Ctrl of a high level and a second control signal CtrlB of a low level are respectively supplied to the first and second control pads TP_C1 and TP_C2 during a driving period dp. Therefore, the first to third switching elements SW11 to SW14, SW 20 to SW24, and SW31 to SW34 included in the first to third switching units 510 to 530 maintain a turned-off state, and the fourth switching elements SW40 to SW43 included in the fourth switching unit 540 are concurrently turned on.

A previous scan signal SSn−1 of a low level is sequentially supplied for each row of the pixels P from the scan driver 200 during a first period t1' of the driving period dp. Therefore, the pixels P are initialized.

Thereafter, a current scan signal SSn of a low level is sequentially supplied for each row of the pixels P during a second period t2' of the driving period dp. Here, the data driver 400 supplies a data signal to the pixels P selected by the current scan signal SSn. Therefore, the data signal is written in the pixels P.

Thereafter, a light emitting control signal EMIn sequentially supplied for each row of the pixels P from the light emitting control driver 300 is changed to a low level and maintained as the low level during a third period t3' of the driving period dp. Therefore, the pixels P display an image with luminance corresponding to the data signal written during the second period t2'.

It has been shown in FIGS. 3 and 7 that the first to fourth switching units 510 to 540 are located at one or more sides of the display unit 100. However, the first to fourth switching units 510 to 540 may be designed to be cut (or removed) after the test is completed.

While the present invention has been described in connection with certain exemplary embodiments, it is to be understood that the present invention is not limited to the disclosed embodiments, but, on the contrary, is intended to cover various modifications and equivalent arrangements included within the spirit and scope of the appended claims, and equivalents thereof.

What is claimed is:

1. An organic light emitting display device comprising:
   a plurality of pixels each electrically coupled to a corresponding one of previous scan lines, a corresponding one of current scan lines, and a corresponding one of data lines;
   a plurality of first switching elements electrically coupled between the previous scan lines of the pixels and a first test pad, and configured to turn on during a first period of a test period to provide a first test control signal supplied from the first test pad to the pixels; and
   a plurality of second switching elements electrically coupled between the current scan lines of the pixels and a second test pad, and configured to turn on during a second period of the test period following the first period to provide a second test control signal supplied from the second test pad to the pixels.

2. The organic light emitting display device as claimed in claim 1, wherein the first and second test control signals are sequentially shifted and supplied.

3. The organic light emitting display device as claimed in claim 1, wherein the first and second switching elements comprise transmission gates each having a positive electrode coupled to a first control pad and a negative electrode coupled to a second control pad.

4. The organic light emitting display device as claimed in claim 3, wherein a first control signal supplied to the first control pad and a second control signal supplied to the second control pad are inverted signals of each other.

5. The organic light emitting display device as claimed in claim 1, wherein each of the first and second switching elements corresponds to a row of the pixels.

6. The organic light emitting display device as claimed in claim 1, wherein each of the pixels is coupled to a corresponding one of light emitting control lines, and
   the organic light emitting display device further comprises a plurality of third switching elements electrically coupled between the light emitting control lines of the pixels and a third test pad, and configured to turn on during a third test period of the test period following the second period to provide a third test control signal supplied from the third test pad to the pixels.

7. The organic light emitting display device as claimed in claim 6, wherein the third switching elements comprise transmission gates each having a positive electrode coupled to a first control pad and a negative electrode coupled to a second control pad.

8. The organic light emitting display device as claimed in claim 7, wherein a first control signal supplied to the first control pad and a second control signal supplied to the second control pad are inverted signals of each other.

9. The organic light emitting display device as claimed in claim 1, further comprising fourth switching elements each coupled between the pixels in a k-th row coupled to the corresponding one of the previous scan lines and the pixels in a (k−1)-th row coupled to the corresponding one of the current scan lines, and configured to maintain an off-state during the test period, wherein k is a natural number.

10. The organic light emitting display device as claimed in claim 9, wherein the fourth switching elements comprise transmission gates each having a positive electrode coupled to a second control pad and a negative electrode coupled to a first control pad.

11. The organic light emitting display device as claimed in claim 1, further comprising a scan driver, a light emitting control driver and a data driver, respectively supplying a scan signal, a light emitting control signal and a data signal to the pixels during a driving period in which the data signal is supplied to the data lines of the pixels after the test period.

12. The organic light emitting display device as claimed in claim 11, wherein the scan driver, the light emitting control driver and the data driver are included in one or more integrated circuit chips.

13. A display panel of an organic light emitting display device comprising:
   a display unit having a plurality of pixels, each of the pixels electrically coupled to a corresponding one of previous scan lines and a corresponding one of current scan lines;
   a plurality of first switching elements electrically coupled to the previous scan lines of the pixels for providing a first test control signal to the pixels during a first period of a lighting test period;
   a plurality of second switching elements electrically coupled to the current scan lines of the pixels for providing a second test control signal to the pixels during a second period of the lighting test period; and
   a plurality of third switching elements electrically coupled to the pixels for providing a third test control signal during a third period of the lighting test period,
   wherein the first, second and third switching elements are configured to turn on during the lighting test period, and the first test control signal and the second test control signal are sequentially shifted and supplied.

14. The display panel of the organic light emitting display device as claimed in claim 13, further comprising fourth switching elements each electrically coupled between the pixels in a k-th row coupled to a corresponding one of the previous scan lines and the pixels in a (k−1)-th row coupled to a corresponding one of the current scan lines, and configured to maintain an off-state during the lighting test period, wherein k is a natural number.

15. The display panel of the organic light emitting display device as claimed in claim 13, wherein the first, second and third switching elements comprise transmission gates each having a positive electrode coupled to a first control pad and a negative electrode coupled to a second control pad.

16. The display panel of the organic light emitting display device as claimed in claim 15, wherein a first control signal supplied to the first control pad and a second control signal supplied to the second control pad are inverted signals of each other.

* * * * *